(12) United States Patent  
Koo et al.

(10) Patent No.: US 8,354,883 B2  
(45) Date of Patent: Jan. 15, 2013

(54) POWER AMPLIFIER

(75) Inventors: Bon Hoon Koo, Daejeon (KR); Ki Yong Son, Daejeon (KR); Song Cheol Hong, Daejeon (KR); Gyu Suck Kim, Seoul (KR); Yoo Sam Na, Seoul (KR)

(73) Assignees: Samsung Electro-Mechanics Co., Ltd., Gyunggi-do (KR); Korea Advanced Institute of Science and Technology, Daejeon (KR)

( * ) Notice: Subject to any disclaimer, the term of this patent is extended or adjusted under 35 U.S.C. 154(b) by 51 days.

(21) Appl. No.: 13/024,144

(22) Filed: Feb. 9, 2011

(65) Prior Publication Data

US 2012/0025907 A1    Feb. 2, 2012

(30) Foreign Application Priority Data

Jul. 28, 2010 (KR) .................. 10-2010-0072730

(51) Int. Cl.  
*H03G 3/20* (2006.01)
(52) U.S. Cl. ......................... 330/136; 330/129
(58) Field of Classification Search ............. 330/129, 330/136, 285, 296  
See application file for complete search history.

(56) References Cited

U.S. PATENT DOCUMENTS

| | | | | |
|---|---|---|---|---|
| 5,861,777 A | * | 1/1999 | Sigmon et al. | 330/136 |
| 7,696,818 B2 | * | 4/2010 | Kunihiro et al. | 330/10 |
| 7,965,140 B2 | * | 6/2011 | Takahashi | 330/136 |
| 8,004,357 B2 | * | 8/2011 | Lee et al. | 330/136 |
| 8,089,313 B2 | * | 1/2012 | Chang et al. | 330/136 |
| 2002/0171483 A1 | | 11/2002 | Shinjo et al. | |

FOREIGN PATENT DOCUMENTS

| | | |
|---|---|---|
| KR | 10-20020064767 A | 8/2002 |
| KR | 1020060027753 A | 3/2006 |
| KR | 10-20080087583 A | 10/2008 |

OTHER PUBLICATIONS

Y.S. Noh, et al., "An Intelligent Power Amplifier MMIC Using a New Adaptive Bias Control Circuit for W-CDMA Applications", IEEE Journal of Solid-State Circuits, vol. 39, No. 6, Jun. 2004, pp. 967-970.  
Korean Office Action 10-2010-0072730 issued Jun. 28, 2011.

* cited by examiner

*Primary Examiner* — Henry Choe  
(74) *Attorney, Agent, or Firm* — Lowe Hauptman Ham & Berner LLP

(57) ABSTRACT

There is provided a power amplifier capable of supplying variable bias to an amplifier circuit by accurately transferring the envelope components of an input signal during the supply of active bias power to the amplifier circuit. The power amplifier includes: an envelope detector detecting an envelope of an input signal; a bias power generator including at least one P-type MOSFET and one N-type MOSFET connected to each other in an inverter manner between a driving power terminal supplying driving power having a preset voltage level and a reference bias power terminal supplying preset reference bias power to generate bias power varied according to detection results from the envelope detector; and an amplifier amplifying the input signal according to the bias power level from the bias power generator.

9 Claims, 6 Drawing Sheets

POWER AMPLIFIER

CROSS-REFERENCE TO RELATED APPLICATIONS

This application claims the priority of Korean Patent Application No. 10-2010-0072730 filed on Jul. 28, 2010, in the Korean Intellectual Property Office, the disclosure of which is incorporated herein by reference.

BACKGROUND OF THE INVENTION

1. Field of the Invention

The present invention relates to a power amplifier, and more particularly, to a power amplifier capable of supplying variable bias to an amplifier circuit by accurately transferring the envelope components of an input signal during the supply of active bias power to the amplifier circuit.

2. Description of the Related Art

Recently, blocks configuring a wireless transceiver are being integrated into a single chip by using a complementary metal oxide semiconductor (CMOS) process technology. In this process, only the power amplifier, among the blocks of the wireless transceiver, is implemented by an indium gallium phosphide (InGaP)/gallium arsenide (GaAs) Heterojunction Bipolar Transistor (HBT) process. However, in the above-mentioned InGaP/GaAs HBT process, manufacturing costs are increased and the power amplifier is formed in a multi-chip structure and thus, it is difficult to couple the power amplifier with an adjustment circuit block implemented by the CMOS process in order to improve linearity, as compared with the CMOS process. For this reason, research into a CMOS process based power amplifier has been actively conducted.

The amplification circuit of the power amplifier is supplied with the bias power to amplify and output an input signal. Generally, the amplification circuit of the power amplifier is supplied with bias power having a preset voltage level.

Meanwhile, a main index evaluating the performance of the power amplifier may include maximum output power (maximum linear output) and maximum efficiency up to a point in which linearity are satisfied greatly and efficiency at a point in which the maximum output power is backed-off.

Comparing with the HBT process, the CMOS process slightly degrades the performance of the power amplifier. As a result, it is a recent trend to supply active bias power in order to increase linearity at the time of implementing the power amplifier using the CMOS process.

FIG. 1 is a schematic configuration diagram of a power amplifier according to the related art and FIGS. 2A and 2B are graphs showing electrical characteristics of the power amplifier according to the related art of FIG. 1.

Reference to FIG. 1, the power amplifier according to the related art may be configured to include an amplifier 11 amplifying an input signal Pin and outputting it as an output signal Pout, a detector 12 detecting a voltage level of the input signal Pin to the amplifier 11, and a voltage generator 13 generating voltage varied according to the detection result of the detector 12 and supplying it to the amplifier 11.

Referring to FIGS. 1, 2A, and 2B, the power amplifier according to the related art delays the bias power from the voltage generator 13 and the input signal Pin, such that the linearity of the output signal Pout from the power amplifier at this point A is degraded as compared with a power amplifier supplying a fixing bias.

SUMMARY OF THE INVENTION

An aspect of the present invention provides a power amplifier capable of supplying variable bias to an amplifier circuit by accurately transferring the envelope components of an input signal during the supply of active bias power to the amplifier circuit.

According to an aspect of the present invention, there is provided a power amplifier, including: an envelope detector detecting an envelope of an input signal; a bias power generator including at least two transistors having opposite polarities and connected to each other in an inverter manner between a driving power terminal supplying driving power having a preset voltage level and a reference bias power terminal supplying preset reference bias power, and generating bias power varied according to detection results from the envelope detector; and an amplifier amplifying the input signal according to the bias power level from the bias power generator.

The bias power generator may include at least one P-type metal-oxide-semiconductor field-effect transistor (MOSFET) and one N-type MOSFET connected to each other in an inverter manner between the driving power terminal and the reference bias power terminal.

The envelope detector may include a first resistor having one terminal and another terminal, the one terminal being connected to the driving power terminal, a first capacitor having one terminal and another terminal and connected to the first resistor in parallel, the one terminal being connected to the driving power terminal; and a first N-type MOSFET having a drain connected to another terminal of the first resistor and another terminal of the first capacitor, a source connected to a ground, and a gate receiving the input signal.

The bias power generator may include a first P-type MOSFET having a source connected to the driving power terminal, a gate connected to another terminal of the first resistor and another terminal of the first capacitor, and a drain; and a second N-type MOSFET having a source connected to the reference bias power terminal, a gate connected to the gate of the first P-type MOSFET, and a drain connected to the drain of the first P-type MOSFET.

The body and the drain of the second N-type MOSFET may be electrically connected to each other.

The power amplifier may further include a low band pass filter unit passing the bias power from the bias power generator at a preset low band.

The low band pass filter unit may include a second capacitor having one terminal connected to a supply terminal supplied with the bias power from the bias power generator and having another terminal connected to a ground; and a second resistor connected to the second capacitor in parallel.

The low band pass filter unit may further include a diode connected to the second capacitor and the second resistor in parallel.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Hereinafter, exemplary embodiments of the present invention will now be described in detail with reference to the accompanying drawings.

Figure 1:
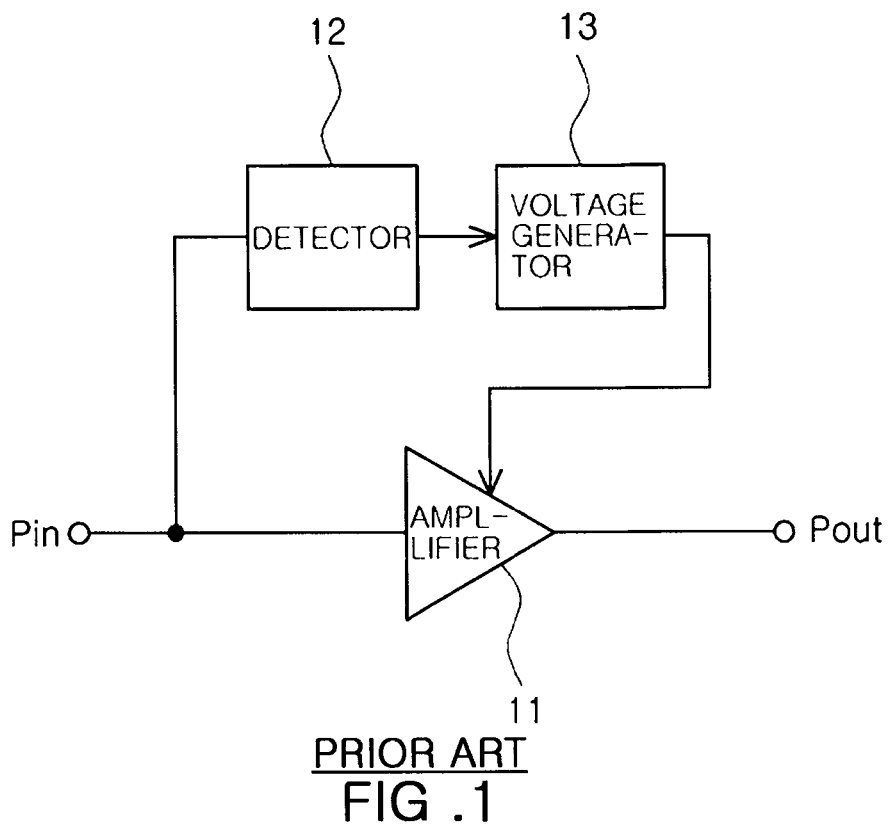
FIG. 1 is a schematic configuration diagram of a power amplifier according to the related art.
Figure 2A:
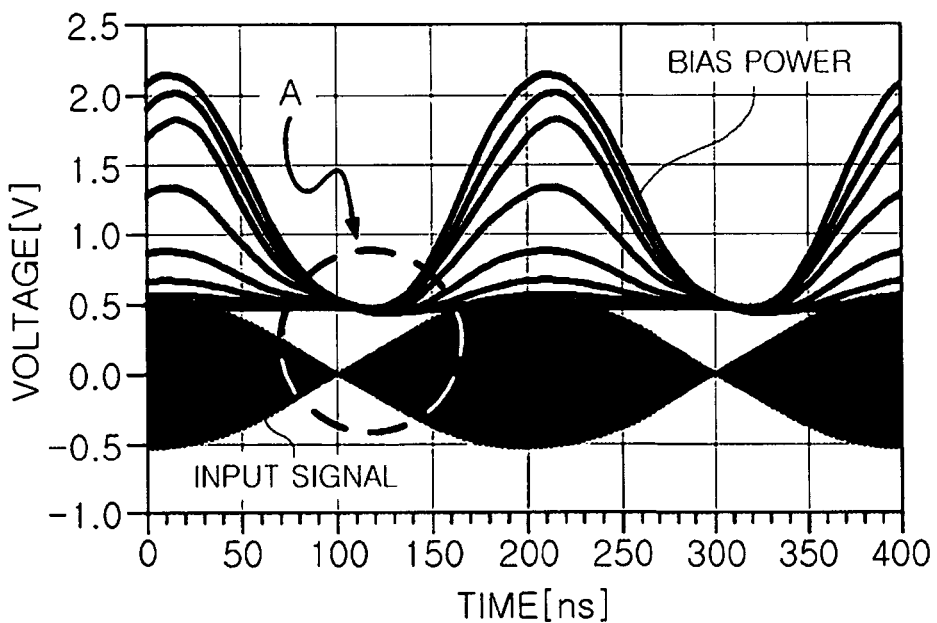
FIGS. 2A and 2B are graphs showing the electrical characteristics of the power amplifier according to the related art of FIG. 1.
Figure 2B:
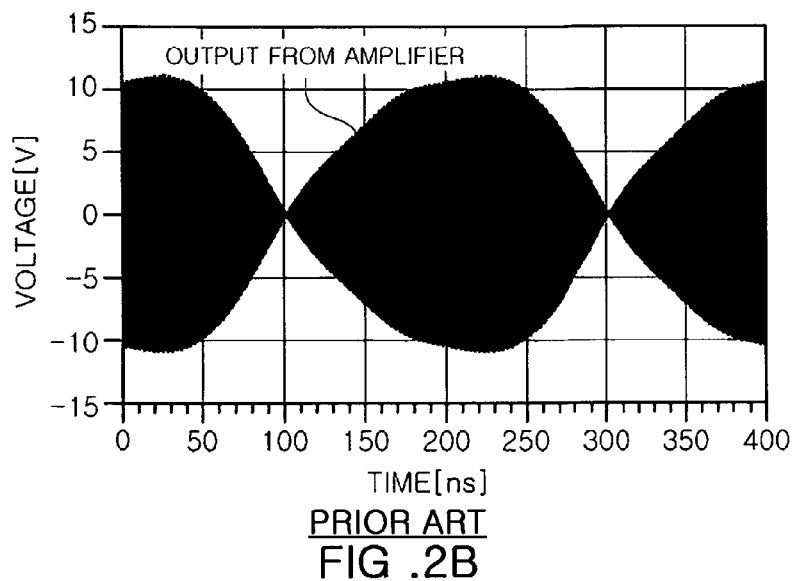
Figure 3:
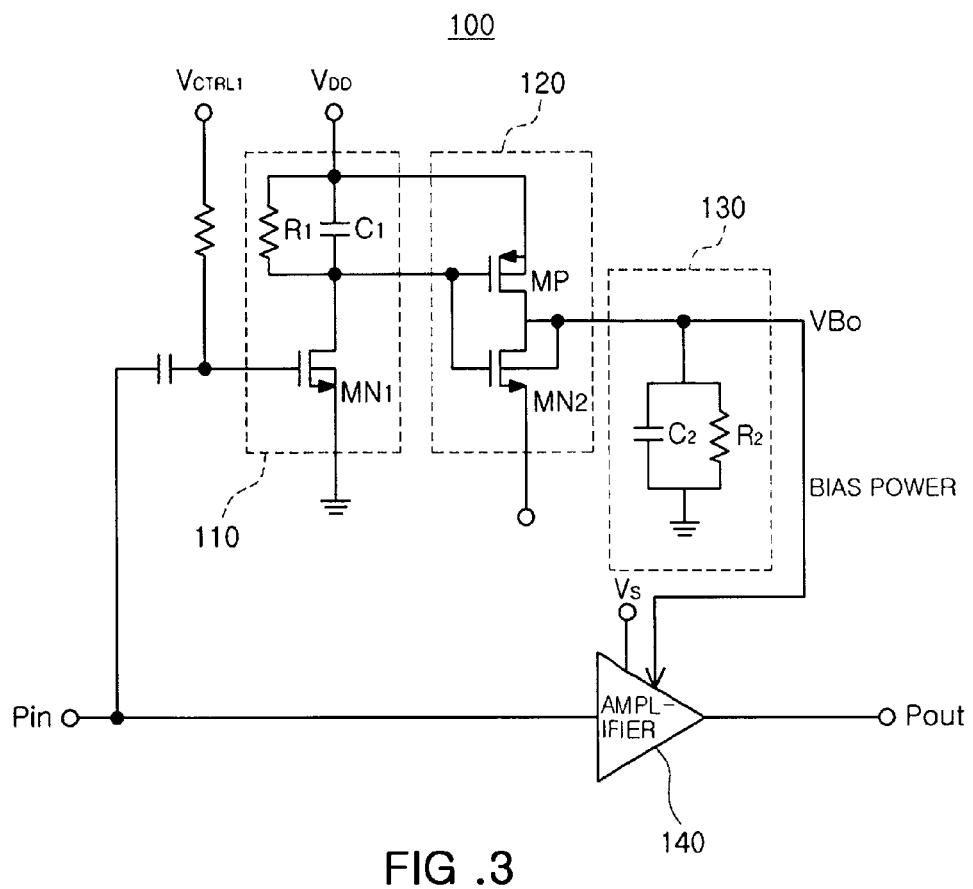
FIG. 3 is a schematic configuration diagram of an exemplary embodiment of a power amplifier according to the present invention.

FIG. 3 is a schematic configuration diagram of an exemplary embodiment of a power amplifier according to the present invention.

Referring to FIG. 3, a power amplifier 100 according to the present invention may include an envelope detector 110, a bias power generator 120, and amplifier 140, and a low band pass filter unit 130.

The envelope detector 110 may include a first resistor R1, a first capacitor C1, and a first N-type MOSFET MN1.

The first resistor R1 and the first capacitor C1 are connected to each other in parallel. One terminal of the first resistor R1 and one terminal of the first capacitor C1 are connected to a driving power terminal supplying driving power $V_{DD}$ having a preset voltage level and another terminal formed at the opposite side to one terminal of the first resistor R1 and another terminal formed at the opposite side to one terminal of the first capacitor C1 are connected to each other, which may be connected to a first N-type metal-oxide-semiconductor field-effect transistor (MOSFET) MN1. The first N-type MOSFET MN1 has a drain, a source, and a gate, wherein the drain of the first N-type MOSFET MN1 is connected to another terminal of the first resistor R1 and another terminal of the first capacitor C1, the source of the first N-type MOSFET MN1 is connected to a ground, and the gate of the first N-type MOSFET MN1 is supplied with an input signal Pin. In this case, the input signal Pin is transferred to the gate of the first N-type MOSFET MN1 via a DC blocking capacitor, such that the AC component of the input signal Pin may be transferred to the gate of the first N-type MOSFET MN1. In addition, gate control power VCTRL1 may also be transferred to the gate of the first N-type MOSFET MN1.

According to the above-mentioned configuration, the envelope detector 110 detects the envelope components of the input signal Pin and transfers the detection results to the bias power generator 120.

The bias power generator 120 generates the bias power varied according to the detection results from the envelope detector 110.

To this end, the bias power generator 120 may include a first P-type MOSFET MP and a second N-type MOSFET (MN2) connected in an inverter manner between the driving power terminal and a reference bias power terminal supplying reference bias power Vs having a preset voltage level.

The source of the first P-type MOSFET MP is connected to the driving power terminal and the gate of the first P-type MOSFET MP is connected to another terminal of the first resistor R1, another terminal of the first capacitor C1, and the drain of the first N-type MOSFET MN1 to receive the detection results and the drain of the first P-type MOSFET MP is connected to a second N-type MOSFET MN2.

The drain of the second N-type MOSFET MN2 is connected to the drain of the first P-type MOSFET MP and the gate of the second N-type MOSFET MN2 is connected to another terminal of the first resistor R1, another terminal of the first capacitor C1, and the drain of the first N-type MOSFET MN1 to receive the detection results and the source of the second N-type MOSFET MN2 is connected to the power terminal of the reference bias.

In order to increase the bias power in proportion to the increase of the detection results, the first P-type MOSFET MP has a size approximately two to three times larger than that of the second N-type MOSFET MN2 in consideration of current mobility.

As described above, the first P-type MOSFET MP and the second N-type MOSFET MN2 connected in the inverter manner can minimize the delay between the input signal Pin input to the amplifier 140 and the envelope components detected from the input signal Pin. That is, when the envelope components are minimized, the bias power VBo may have the voltage level of the reference bias power Vs by turning-on the second N-type MOSFET MN2 while turning-off the first P-type MOSFET MP. Therefore, the delay between the input signal Pin input to the amplifier 140 and the envelope components detected from the input signal (Pin) is minimized, thereby making it possible to increase the linearity of the power amplifier 100.

In addition, the bias power generator 120 includes a limit increasing the output bias power to an appropriate level in order to prevent gate oxide breakdown caused due to the increase of the bias power. The bias power generator 120 connects the drain and the body of the second N-type MOSFET MN2 to each other without adopting a separate limit circuit to turn-on the second N-type MOSFET MN2 PN junction diode when the bias power level is of the preset value or more.

The amplifier 140 amplifies the input signal Pin according to the voltage level of the bias power supplied from the bias power generator 120 to output the output signal Pout. The amplifier 140 may be supplied with reference bias power Vs at the start of operation.

The low band pass filter unit 130 may pass the bias power VBo from the bias power generator 120 as the preset low band. To this end, the low band pass filter unit 130 may include a second resistor R2 and a second capacitor C2. The second resistor R2 and the second capacitor C2 may be connected to each other in parallel and one terminal of the second resistor R2 and one terminal of the second capacitor C2 are connected to the output terminal of the bias power generator 120 and another terminal of the second resistor R2 and another terminal of the second capacitor C2 may be connected to a ground.

Figure 4:
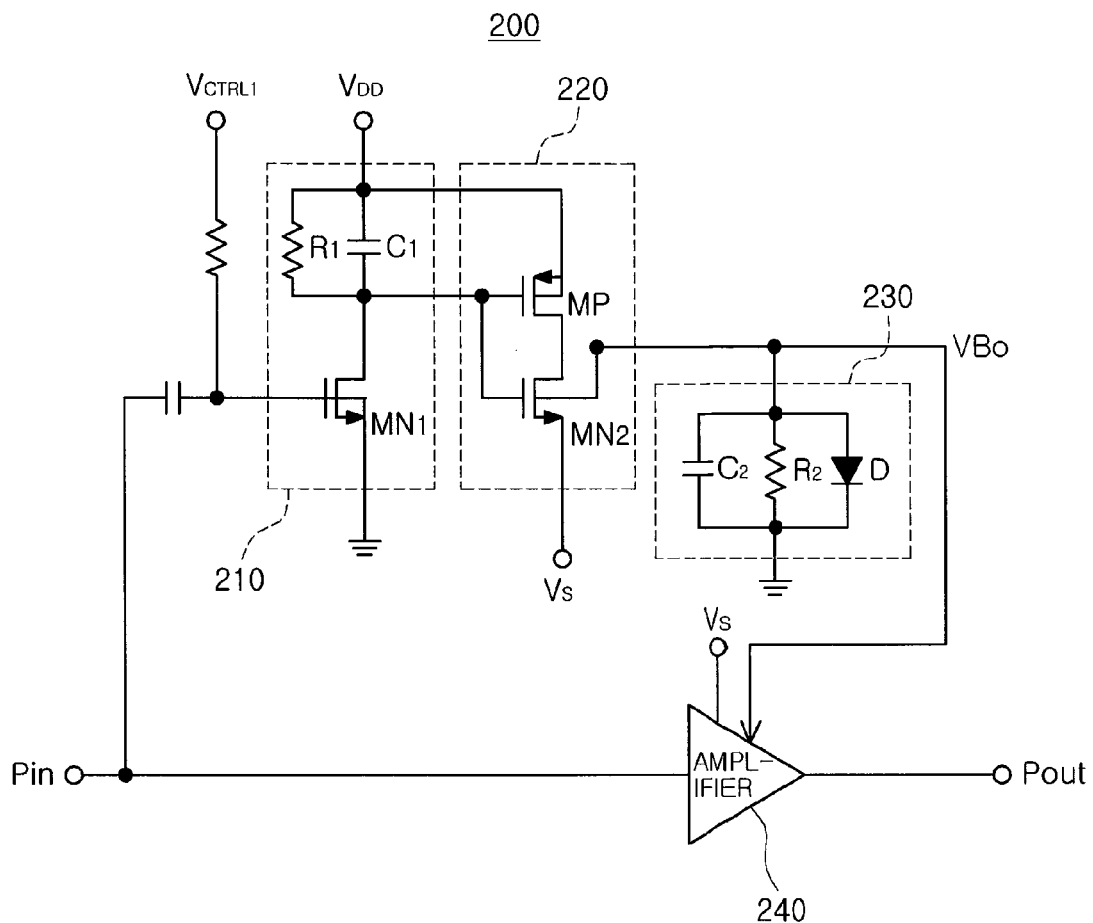
FIG. 4 is a schematic configuration diagram of another exemplary embodiment of a power amplifier according to the present invention.

FIG. 4 is a schematic configuration diagram of another exemplary embodiment of a power amplifier according to the present invention.

Referring to FIG. 4, another exemplary embodiment 200 of the power amplifier of the present invention has a different configuration of a low band pass filter unit 230, as compared with the components shown in FIG. 3. The configuration and function of an envelope detector 210, a bias power generator 220, and an amplifier 240 are similar to the components shown in FIG. 3 other than the low band pass filter unit 230 and therefore, a description thereof will be omitted.

The low band pass filter unit 230 may include a second resistor R2, a second capacitor C2, and a diode D. The second resistor R2, the second capacitor C2, and the diode D may be connected to each other in parallel and one terminal of the second resistor R2, one terminal of the second capacitor C2, and one terminal of the diode D are connected to the output terminal of the bias power generator 220, another terminal of the second resistor R2, another terminal of the second capacitor C2, and another terminal of the diode D may be connected to a ground.

Figure 5A:
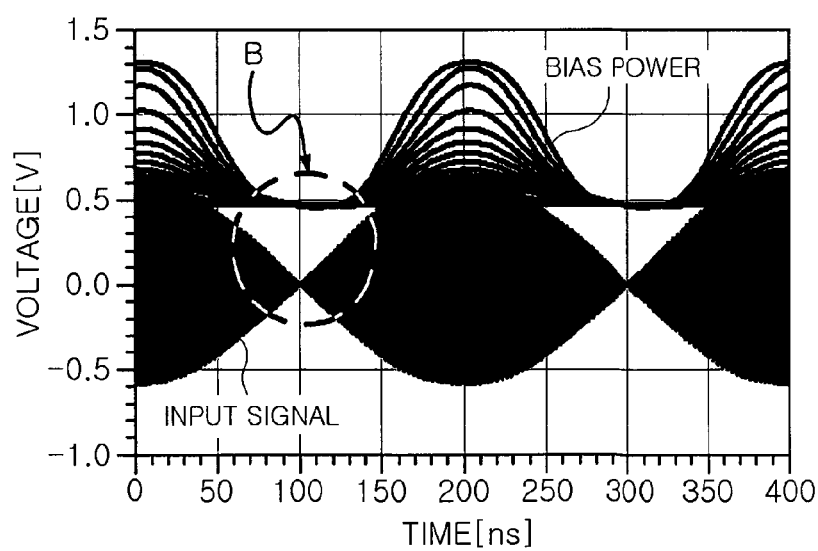
FIGS. 5A and 5B are graphs showing the electrical characteristics of the power amplifier according to the present invention.
Figure 5B:
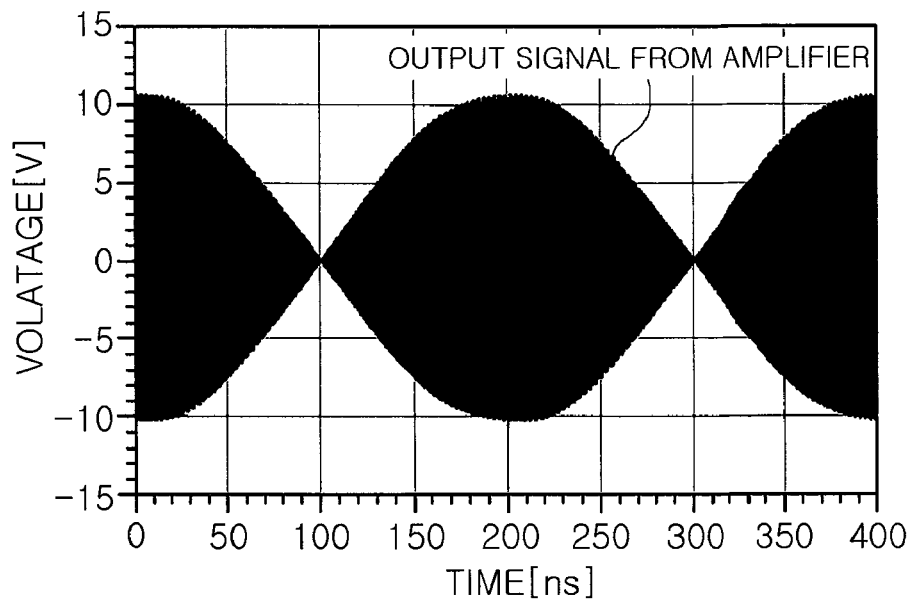

FIGS. 5A and 5B are graphs showing the electrical characteristics of the power amplifier according to the present invention.

In the power amplifier of the present invention, when the envelope components are minimized, the bias power VBo may have the voltage level of the reference bias power Vs by turning-on the second N-type MOSFET MN2 while turning-off the first P-type MOSFET MP. Therefore, as shown in FIG. 5A, the delay between the input signal Pin input to the amplifier 140 and the envelope components detected from the input signal Pin is minimized, such that the distortion of the output signal Pout from the power amplifier can be reduced as shown in FIG. 5B.

Figure 6:
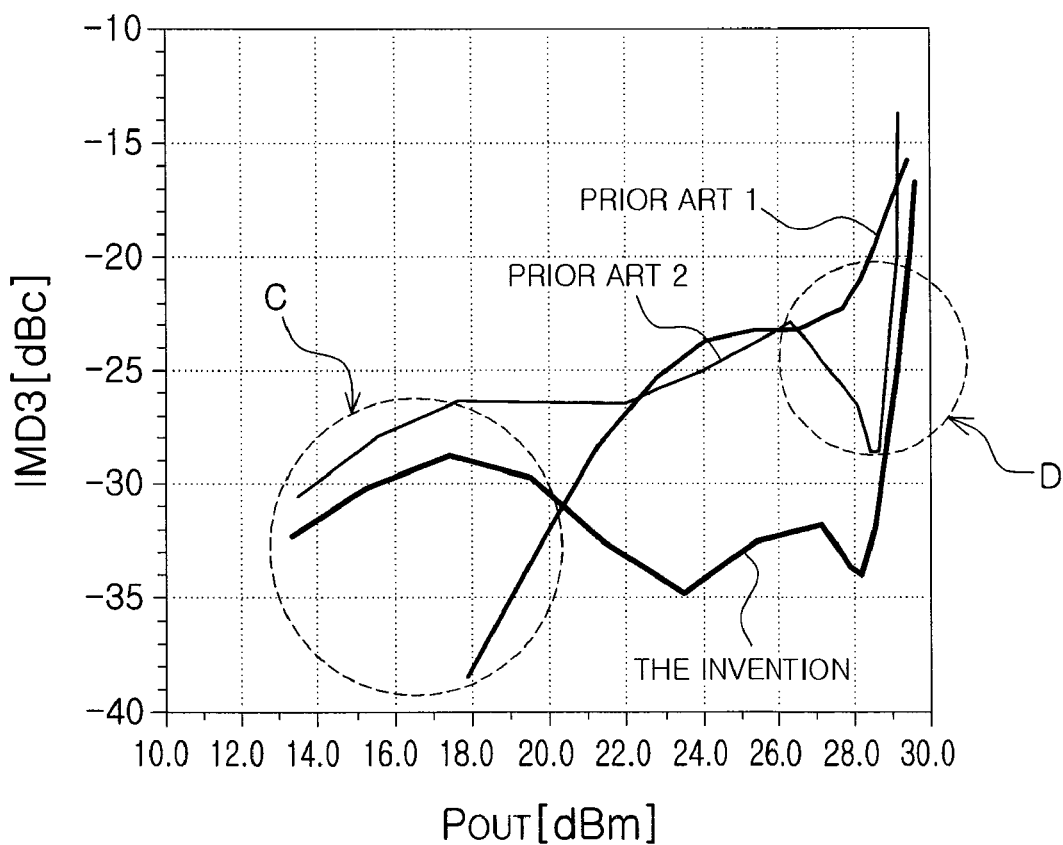
FIG. 6 is a graph comparing the linearity of the power amplifier according to the related art and the present invention.
Figure 7:
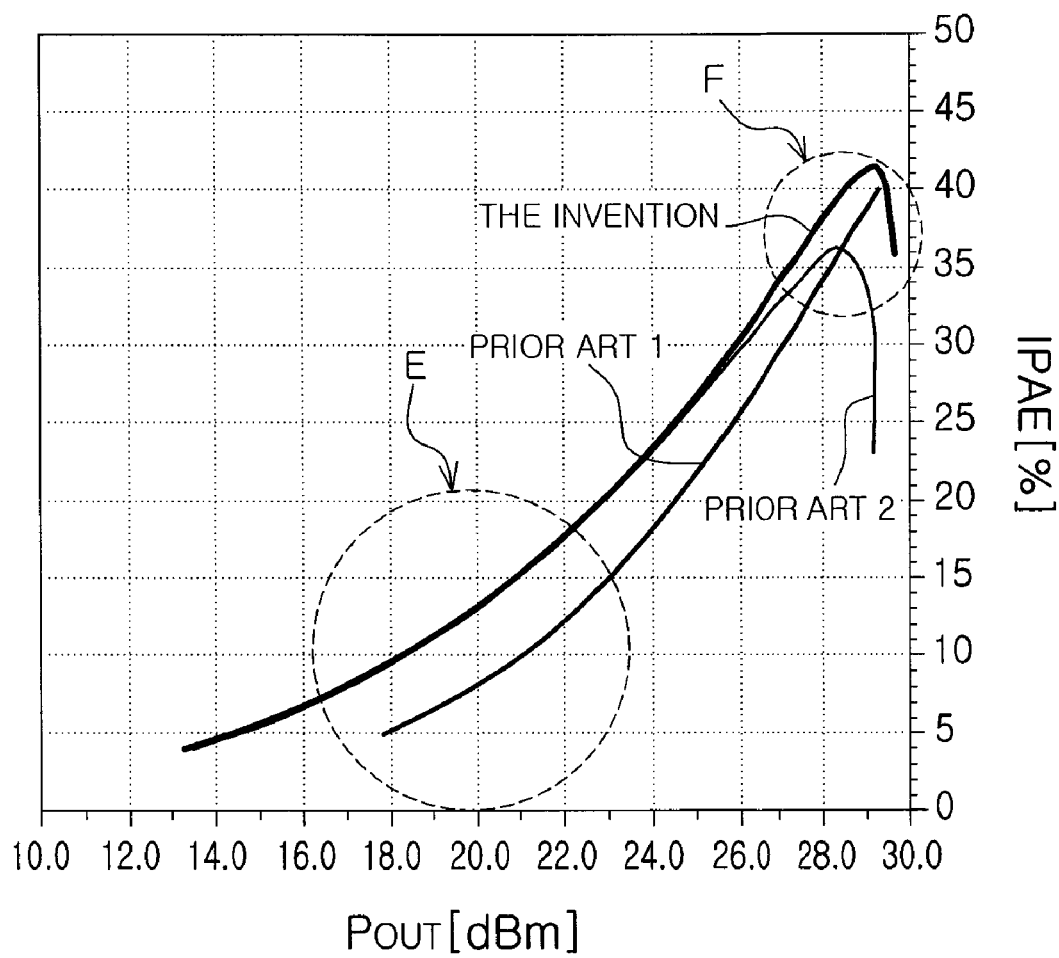
FIG. 7 is a graph comparing the efficiency of the power amplifier according to the related art to that of the present invention.

FIG. 6 is a graph comparing the linearity of the power amplifier according to the related art and the present invention and FIG. 7 is a graph comparing the efficiency of the power amplifier according to the related art and the present invention.

Referring to FIGS. 6 and 7, the power amplifier according to the related art supplying the fixing bias power to the amplification circuit is represented by prior art 1 and the power amplifier detecting the input signal level to vary the bias power is represented by prior art 2.

It can be appreciated from FIG. 6 that the power amplifier represented by prior art 1 has good linearity in a low power band (reference sign C) but has poor linearity in a high power band (reference sign D), while the power amplifier of prior art 2 has poor linearity in the low power band (reference sign C) but has good linearity in a high power band (reference sign D). However, it can be appreciated that the power amplifier according to the present invention increases the linearity thereof by approximately maximally 10 dB in the entire power band.

It can be appreciated from FIG. 7 that the power amplifier of prior art 1 has the lowest efficiency in a low power band (reference sign E) and a high power band (reference sign F) and the power amplifier of prior art 2 has an efficiency lower than that of the present invention in the high power band (reference sign F) and the power amplifier of the present invention increases efficiency in the entire power band.

Figure 8:
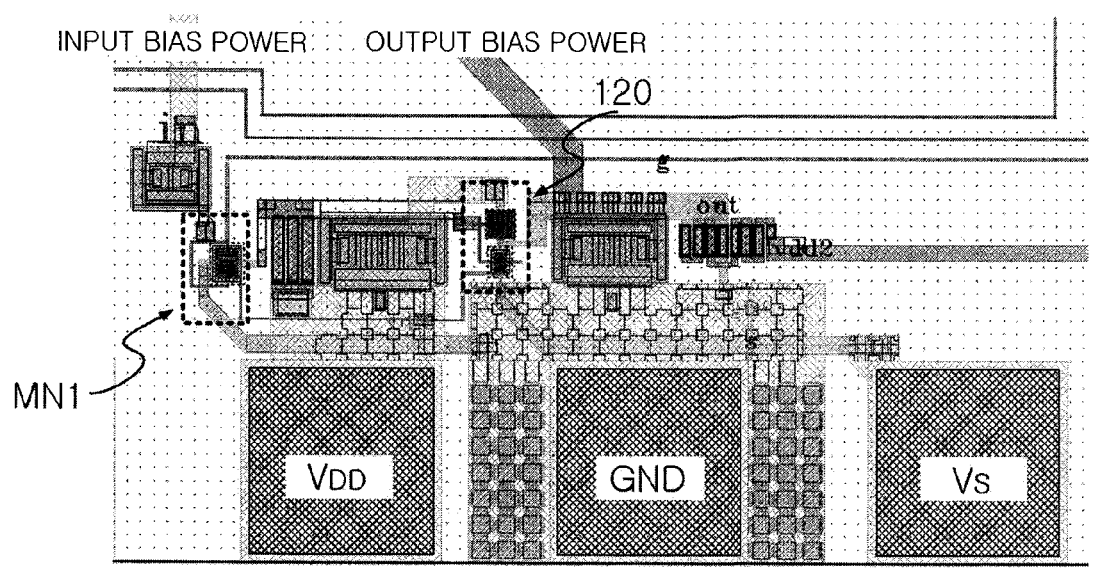
FIG. 8 is a configuration diagram implementing the power amplifier according to the present invention as an integrated circuit.

FIG. 8 is a configuration diagram implementing the power amplifier according to the present invention as an integrated circuit.

Referring to FIG. 8, the power amplifier of the present invention may be implemented as an integrated circuit by the CMOS process.

As described above, according to the present invention, when the envelope components are minimized, the bias power VBo has the voltage level of the reference bias power Vs by turning-on the second N-type MOSFET MN2 while turning-off the first P-type MOSFET MP, such that the delay between the input signal Pin input to the amplifier 140 and the envelope components detected from the input signal Pin is minimized, thereby making it possible to reduce the distortion of the output signal from the power amplifier 100 and increase the linearity of the power amplifier 100.

As set forth above, the present invention supplies the variable bias to the amplifier circuit by accurately transferring the envelope components of the input signal during the supply of the active bias power to the amplifier circuit to minimize the delay between the input signal supplied to the amplifier circuit and the envelope information of the input signal supplied to the bias circuit, thereby making it possible to increase the linearity of the power amplifier.

While the present invention has been shown and described in connection with the exemplary embodiments, it will be apparent to those skilled in the art that modifications and variations can be made without departing from the spirit and scope of the invention as defined by the appended claims.

What is claimed is:

1. A power amplifier comprising:
    an envelope detector configured to detect an envelope of an input signal;
    a bias power generator including at least two transistors having opposite polarities and connected to each other in an inverter manner between a driving power terminal for supplying driving power having a preset voltage level and a reference bias power terminal for supplying preset reference bias power, the bias power generator configured to generate bias power varied according to a detection result from the envelope detector; and
    an amplifier configured to amplify the input signal according to a level of the bias power from the bias power generator, wherein
    the at least two transistors comprise at least a P-type metal-oxide-semiconductor field-effect transistor (MOSFET) and an N-type MOSFET, and
    the envelope detector includes:
        a first resistor having a first terminal and a second terminal, the first terminal of the first resistor being connected to the driving power terminal;
        a first capacitor having a first terminal and a second terminal and connected to the first resistor in parallel, the first terminal of the first capacitor being connected to the driving power terminal; and
        a first N-type MOSFET having a drain connected to the second terminal of the first resistor and the second terminal of the first capacitor, a source connected to a ground, and a gate for receiving the input signal.

2. The power amplifier of claim 1, wherein the bias power generator includes:
    a first P-type MOSFET having a source connected to the driving power terminal, a gate connected to the second terminal of the first resistor and the second terminal of the first capacitor, and a drain; and
    a second N-type MOSFET having a source connected to the reference bias power terminal, a gate connected to the gate of the first P-type MOSFET, and a drain connected to the drain of the first P-type MOSFET.

3. The power amplifier of claim 2, wherein a body and the drain of the second N-type MOSFET are electrically connected to each other.

4. A power amplifier, comprising:
    an envelope detector detecting an envelope of an input signal;
    a bias power generator including at least one P-type metal-oxide-semiconductor field-effect transistor (MOSFET) and one N-type MOSFET connected to each other in an inverter manner between a driving power terminal supplying driving power having a preset voltage level and a reference bias power terminal supplying preset reference bias power to generate bias power varied according to detection results from the envelope detector;

an amplifier amplifying the input signal according to the bias power level from the bias power generator; and
a low band pass filter unit passing the bias power from the bias power generator at a preset low band,
wherein the envelope detector includes:
a first resistor having one terminal and another terminal, the one terminal being connected to the driving power terminal;
a first capacitor having one terminal and another terminal and connected to the first resistor in parallel, the one terminal being connected to the driving power terminal; and
a first N-type MOSFET having a drain connected to another terminal of the first resistor and another terminal of the first capacitor, a source connected to a ground, and a gate receiving the input signal,
the bias power generator includes:
a first P-type MOSFET having a source connected to the driving power terminal, a gate connected to another terminal of the first resistor and another terminal of the first capacitor, and a drain;
a second N-type MOSFET having a source connected to the reference bias power terminal, a gate connected to the gate of the first P-type MOSFET, and a drain connected to the drain of the first P-type MOSFET, and
the low band pass filter unit includes:
a second capacitor having one terminal connected to a supply terminal supplied with the bias power from the bias power generator and another terminal connected to a ground; and
a second resistor connected to the second capacitor in parallel.

5. The power amplifier of claim 4, wherein the body and the drain of the second N-type MOSFET are electrically connected to each other.

6. The power amplifier of claim 4, wherein the low band pass filter unit further includes a diode connected to the second capacitor and the second resistor in parallel.

7. The power amplifier of claim 1, further comprising a low band pass filter unit for passing the bias power from the bias power generator at a preset low band.

8. The power amplifier of claim 7, wherein the low band pass filter unit includes:
a second capacitor having a first terminal connected to a supply terminal supplied with the bias power from the bias power generator and a second terminal connected to the ground; and
a second resistor connected to the second capacitor in parallel.

9. The power amplifier of claim 8, wherein the low band pass filter unit further includes a diode connected to the second capacitor and the second resistor in parallel.

* * * * *